United States Patent [19]

Sato

[11] 4,287,289
[45] Sep. 1, 1981

[54] PHOTORESIST CYCLIZED RUBBER AND BISAZIDE COMPOSITIONS CONTAINING A MONOAZO PHOTOEXTINCTION AGENT

[75] Inventor: Takayuki Sato, Yokosuka, Japan

[73] Assignee: Tokyo Ohka Kogyo Kabushiki Kaisha, Kawasaki, Japan

[21] Appl. No.: 49,613

[22] Filed: Jun. 19, 1979

[30] Foreign Application Priority Data

Sep. 8, 1978 [JP] Japan .............................. 53-109814

[51] Int. Cl.³ .......................... G03C 1/70; G03C 1/71
[52] U.S. Cl. .................................... 430/196; 430/197; 430/519; 430/926; 430/927; 430/311
[58] Field of Search ............... 430/196, 197, 286, 926, 430/927, 325, 326, 519, 311

[56] References Cited

U.S. PATENT DOCUMENTS

| | | | |
|---|---|---|---|
| 2,852,379 | 9/1958 | Hepher et al. | 430/197 |
| 3,567,453 | 3/1971 | Borden | 430/163 |
| 4,075,019 | 2/1978 | Do Minh | 430/936 |

FOREIGN PATENT DOCUMENTS 51-37562  3/1976  Japan .

Primary Examiner—Charles L. Bowers, Jr.
Attorney, Agent, or Firm—Brisebois & Kruger

[57] ABSTRACT

A novel photoresist composition is proposed which is very advantageously employed in the photoetching process for the manufacture of various kinds of electronic devices such as transistors, ICs, LSIs and the like. The photoresist composition of the invention comprises a cyclized rubber as the base component and a specified azobenzene compound as a photoextinction agent for preventing halation in the exposure of the photoresist films to ultraviolet light. The advantages of the inventive photoresist composition over the conventional ones are obtained in the remarkable stability of the halation preventing effect even after a prebaking treatment of the photoresist films at an elevated temperature to remove the solvent from the photoresist films applied on to the substrate surfaces owing to the unexpectedly small sublimation of the azobenzene compound contained in the photoresist films.

9 Claims, 4 Drawing Figures

PHOTORESIST CYCLIZED RUBBER AND BISAZIDE COMPOSITIONS CONTAINING A MONOAZO PHOTOEXTINCTION AGENT

BACKGROUND OF THE INVENTION

The present invention relates to a novel photoresist composition containing a photoextinction agent suitable for fine processing of semiconductor devices or, in particular, to a photoresist composition capable of maintaining its high performance even by the prebaking carried out at an elevated temperature.

Various kinds of electronic devices such as transistors, ICs, LSIs and the like are manufactured by fine processing on the surface of substrates such as high-purity silicon semiconductors utilizing the techniques of photoetching. The procedure for the preparation of electronic devices by the photoetching techniques is carried out by first providing a layer of a photoresist on the surface of a wafer of silicon semiconductor, overlaying the photoresist layer with a mask or a transparency bearing desired image-wise patterns, exposing the photoresist layer through the mask or transparency to give image-wise exposure, developing the thus exposed photoresist layer to leave the pattern-wise layer of the photoresist followed by etching and selective diffusion on the etched areas to impart desired characteristics. It is usual that the above described processes are repeated several times each with a selective diffusion followed by providing electrodes and wiring connection with aluminum deposited on suitable portions of the surface giving a final electronic device.

One of the difficult problems in the above procedures utilizing a photoresist composition is as follows. When the step of the selective diffusion is repeated several times on a wafer surface, there can often be produced a step-like difference in the surface level of 1 $\mu$m or larger and this step-like height difference on the surface is further increased by the subsequent passivation treatment. It is rather a difficult problem to obtain a fine wiring of aluminum of a few $\mu$m or finer with high fidelity on such a rugged surface by the techniques of deposition of aluminum and photoetching as described above, especially, when the photoresist composition is a negative type one due to the strong halation in the photoresist layer by the irregular reflection of the incident light projected perpendicularly to the wafer surface at the sloped portions around the steps on the rugged surface with high reflectivity of the aluminum.

Various attempts have been undertaken to reduce the halation in the photoresist layer in order to reproduce very fine patterns of the photoresist with high fidelity, among which addition of a photoextinction agent is the most promising way (see, for example, Japanese Patent Publication No. 51-37562).

With a solution type photoresist composition formulated, for example, with a cyclized rubber and a bisazide compound as a crosslinking agent, however, there is a limitation in the use of a hitherto known photoextinction agent added to the composition due to the sublimation or dissipation of the photoextinction agent in the course of prebaking carried out at an elevated temperature. Namely, a treatment of prebaking of a substrate coated with a solution type photoresist composition is indispensable in order to completely remove any trace amount of the residual solvent from the photoresist layer to enhance the adhesion of the photoresist layer to the substrate surface while the conventional photoextinction agent such as Oil Yellow which is an organic dyestuff is readily dissipated at the prebaking temperature of 80° to 100° C. so that the halation preventing effect is greatly reduced or, if not reduced so far, subject to variation according to the uncontrollable conditions in the prebaking treatment. Lower temperatures of prebaking treatment are usually unsatisfactory because, although the loss of the photoextinction agent by decomposition or dissipation can be avoided, the remaining solvent left in the photoresist layer may result in decreased adhesion of the photoresist layer to the substrate surface as well as in the appearance of ripples in the photoresist layer after development.

Several kinds of bisazo compounds have been proposed as expressed by the following structural formulas as the photoextinction agents to be formulated in a photoresist composition with a cyclized rubber as the base component.

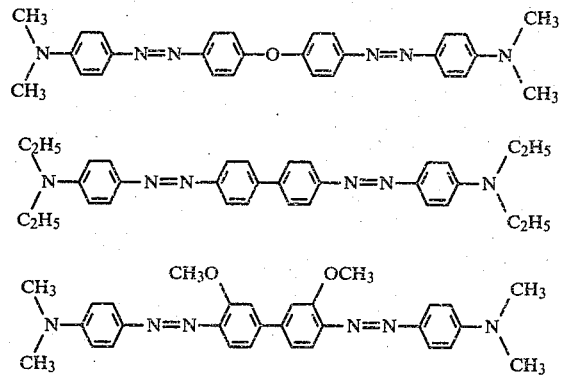

These compounds have good compatibility with cyclized rubbers and do not sublimate so that they are excellent as a photoextinction agent for preventing halation in the photoresist layer. They are, however, disadvantageous from the practical standpoint because they are too expensive by the difficulties in the synthetic preparation owing to their very complicated chemical structures.

SUMMARY OF THE INVENTION

It is therefore an object of the present invention to present a novel solution type photoresist composition with a photoextinction agent free from the above described problems in the prior art photoresist compositions capable of retaining its high performance of very small halation and high photosensitivity even after the prebaking treatment at an elevated temperature for complete removal of the solvent from the photoresist layer on the substrate surface.

Another object of the present invention is to present a novel photoresist composition formulated with a photoextinction agent which is a readily available compound with less expensiveness.

The photoresist composition of the invention comprises a cyclized rubber as the base component and an azobenzene compound represented by the general formula

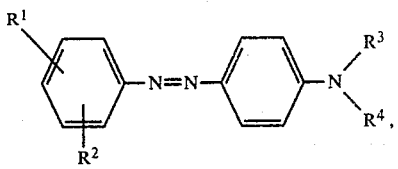

(I)

in which $R^1$ is a lower alkoxy group, $R^2$ is a hydrogen atom or a lower alkyl group and $R^3$ and $R^4$ are each a lower alkyl group having at least two carbon atoms or an aralkyl group, as a photoextinction agent.

DETAILED DESCRIPTION OF THE PREFERRED EMBODIMENTS

Figure 1:
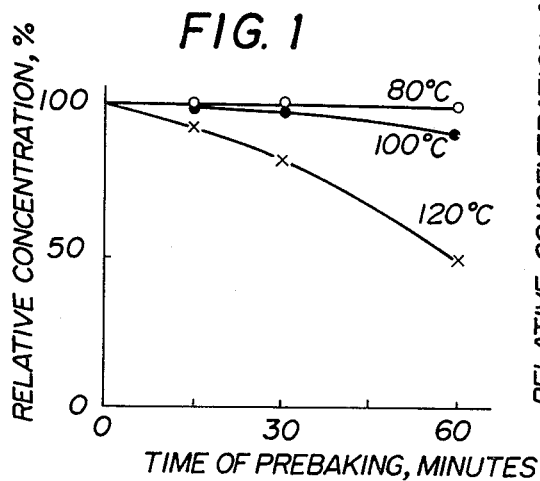
FIG. 1 shows the relative concentration of 1-ethoxy-4-(4'-N,N-diethylaminophenylazo)benzene in the prebaked photoresist films as a function of the time of prebaking at varied temperatures.

In the following, the present invention is described in detail.

The base component of the inventive photoresist composition is a compound known by the name of a cyclized rubber or cyclorubber conventionally used in the prior art photoresist compositions and such a cyclized rubber is available commercially in the form of a solution in an organic solvent such as xylene and the like, in most cases, with admixture of a conventional crosslinking agent such as a bisazide compound under the commercial names of, for example, OMR-83 (product by Tokyo Ohka Co.), Way Coat (product by Philip A. Hunt Chemical Co.), KMR (product by Eastman Kodak Co.) and others. These commercial products may be used in the present invention as such without further processing.

The photoextinction agent to be formulated in the inventive photoresist composition is an azobenzene compound represented by the above given general formula (I), in which $R^1$ is a lower alkoxy group having 1 to 6 carbon atoms such as methoxy, ethoxy, propoxy, butoxy, pentoxy and hexoxy groups. Among them, the most preferred is ethoxy group by the reason of easiness in the synthetic preparation of the azobenzene compound. The position of nuclear substitution of the alkoxy group $R^1$ is not limitative but the para-position relative to the azo group is recommended also by the reason of easiness in the synthetic preparation.

The symbol $R^2$ in the general formula represents a hydrogen atom or a lower alkyl group, preferably, having 1 to 4 carbon atoms such as methyl, ethyl, propyl and butyl groups. Among them, an advantage is obtained with a hydrogen atom or methyl group in the easiness in the synthetic preparation of the compound although butyl group is recommended when higher effectiveness is desired.

The groups represented by the symbols $R^3$ and $R^4$ are each a lower alkyl group having at least two carbon atoms such as ethyl, propyl and butyl groups or an aralkyl group such as benzyl group. The groups $R^3$ and $R^4$ are not necessarily the same and any one of the combinations of the above named alkyl groups and aralkyl groups may be operable. For example, a combination of an ethyl group and a benzyl group is recommended from the standpoint of low sublimation. When one or both of the groups $R^3$ and $R^4$ are methyl groups, the azobenzene compound has an increased sublimation so that the halation-preventing effect of the compound in the composition is reduced by the prebaking treatment.

Thus, the azobenzene compounds in conformity with the general formula (I) and with the definitions of the groups $R^1$ to $R^4$ are exemplified by the following compounds.

1-ethoxy-4-(4'-N,N-diethylaminophenylazo)benzene 1-n-propyl-3-methoxy-4-(4'-N,N-diethylaminophenylazo)benzene 1-n-pentoxy-4-(4'-N,N-diethylaminophenylazo)benzene 1-ethoxy-4-(4'-N,N-ethylbenzylaminophenylazo)benzene 1-ethoxy-2-butyl-4-(4'-N,N-diethylaminophenylazo)benzene These azobenzene compounds have good compatibility with the cyclized rubber as the base component in the inventive photoresist composition and they are formulated in the composition in an amount ranging from 0.5 to 15% or, preferably, from 1 to 5% by weight based on the content of the cyclized rubber. When the amount of the azobenzene compound is smaller than above, the halation preventing effect may be insufficient while an excessive amount of the compound over the above range is not recommended due to the possible precipitation of the compound in a crystalline form within the film of the photoresist composition after the solvent has been removed resulting in inhomogeneity of the halation preventing effect.

As is understood from the above description, the inventive photoresist composition is prepared usually in the form of a solution in a suitable organic solvent and the solid content of the solution is not limitative insofar as good workability and uniformity of the photoresist layer on the substrate can be ensured with suitable viscosity or consistency of the composition.

The azobenzene compound as the photoextinction agent in the inventive photoresist composition is very stable and hardly sublimates even in the prebaking treatment of the photoresist film at an elevated temperature of 80° to 100° C. or higher so that the solvent in the film can be removed completely with full exhibition of the adhesive strength of the photoresist film to the surface of the substrate. Therefore, the halation preventing effect of the photoextinction agent is retained after the prebaking treatment with high fidelity and reproducibility in the exposure to light to give very fine patterns.

It is of course that the drawbacks of the ripples on the photoresist films after development can be avoided with the inventive photoresist composition. Furthermore, the inventive photoresist composition ensures a wide latitude in the photoetching conditions with easiness in handling. In addition, the inventive composition is suitable for mass production of large numbers of semiconductor devices with uniform quality utilizing a mask aligner of projection type desirable for ultra-fine working owing to the high photosensitivity not decreased by the addition of the photoextinction agent.

In the following, the present invention is described in further detail by way of examples.

EXAMPLE

A photoresist composition according to the invention was prepared by dissolving 1-ethoxy-4-(4'-N,N-diethylaminophenylazo)benzene in a commercially available photoresist composition OMR-83 containing 12% by weight of a cyclized rubber dissolved in xylene with admixture of a small amount of a bisazide compound as a crosslinking agent. The amount of the above azobenzene compound was 3% by weight based on the content of the cyclized rubber in the OMR-83 composition. This composition was named as Photoresist A.

A comparative photoresist composition was prepared with the same formulation as above excepting for the use of a yellow dyestuff known by the trivial name of Oil Yellow in place of the above azobenzene compound. This comparative composition was named as Photoresist B.

Figure 2:
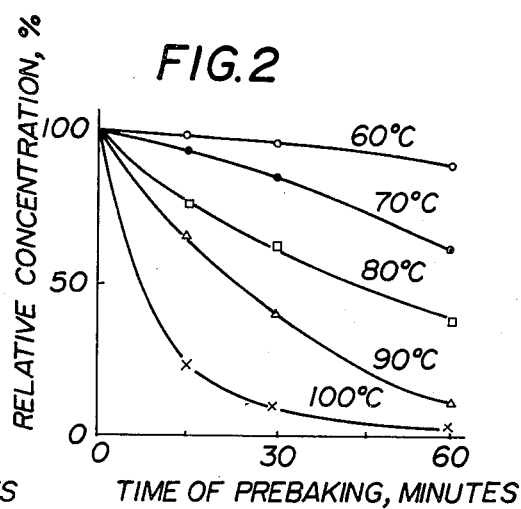
FIG. 2 shows the relative concentration of Oil Yellow in the prebaked photoresist films as a function of the time of prebaking at varied temperatures.

Silicon wafers with an oxide surface film of 8000 Å thickness were coated with the above prepared Photoresist A or B by use of a spinner in a coating thickness of 1.0 μm as dried and subjected to a prebaking treatment at a temperature from 60° to 100° C. for varied length of time up to 60 minutes. The thus prebaked photoresist films were examined for the concentration of the added photoextinction agent, i.e. the azobenzene compound or the Oil Yellow, as a function of the prebaking time to give the results shown in FIGS. 1 and 2, respectively, in which the concentrations are given by the relative values to the initial concentration.

As is clear from these figures, the concentration of the azobenzene compound in Photoresist A was almost constant at a prebaking temperature of 80° C. and only slightly decreased at a prebaking temperature of 100° C. while the concentration of Oil Yellow in Photoresist B markedly decreased by the prebaking treatment at 80° C. or higher.

The remarkable stability of the azobenzene compound in the inventive photoresist composition is an unexpected discovery since the azobenzene compound per se sublimates rather readily with a velocity approximately equal to that of Oil Yellow when they are heated as such without being incorporated into a photoresist composition.

The silicon wafers provided with the films of Photoresist A or B as described above and prebaked at 60° C. or 80° C. for 20 minutes were exposed to ultraviolet light from an ultra-high pressure mercury lamp of 200 watts through a chromium-deposited stepped tablet followed by development with a developing solution which was a mixed solvent composed of 80% by volume of a petroleum fraction boiling at 80° to 120° C. and 20% by volume of xylene.

Figure 3:
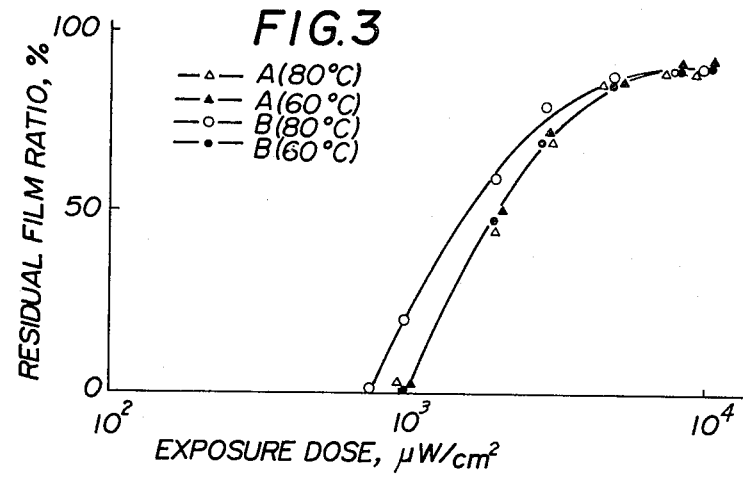
FIG. 3 shows the residual film ratio as a function of the exposure dose of the photoresist films obtained with 1-ethoxy-4-(4'-N,N-diethylaminophenylazo)benzene (curves A) or with Oil Yellow (curves B) prebaked at 60° C. or 80° C.

After drying of the developing solution, the residual film ratio was determined for each of the steps with different exposure doses to give the results shown in FIG. 3 in which the residual film ratio is expressed as a function of the exposure dose.

As is clear from the results shown in FIG. 3, no substantial difference was found between the values of the residual film ratio of the inventive Photoresist A for the prebaking temperatures of 60° C. and 80° C. indicating that the photosensitivity of the photoresist film was not affected by the difference in the prebaking temperature while the photosensitivity of the comparative Photoresist B was higher with the prebaking temperature of 80° C. than at 60° C. showing the instability of the photoextinction agent by dissipation or decomposition. Incidentally, the sensitivity curve for Photoresist B with the prebaking temperature of 80° C. approximates the curve without the addition of a photoextinction agent.

Further, silicon wafers with a deposited surface film of aluminum were coated with the above prepared Photoresist A or B by use of a spinner in a coating thickness of 1.0 μm as dried and subjected to prebaking at a temperature of 70° to 120° C. for 20 minutes followed by the exposure to ultraviolet light with an ultra-high pressure mercury lamp of 200 watts through a mask with a test chart for the resolving power followed by development with the same developing solution as above. After drying, the resolving power was determined to give the results shown in FIG. 4 as a function of the prebaking temperature.

Figure 4:
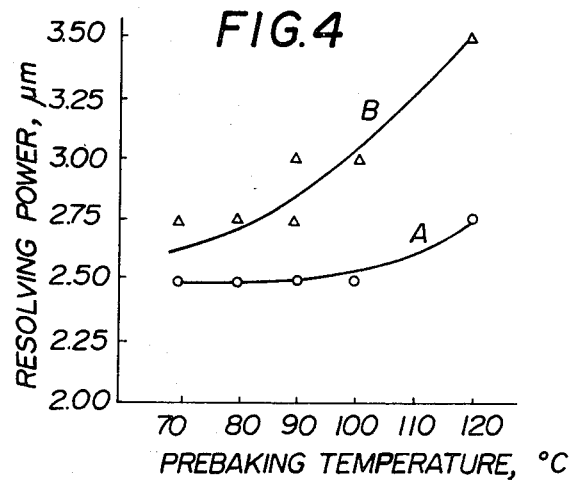
FIG. 4 shows the resolving power of the photoresist films as a function of the prebaking temperature. Curve A: 1-ethoxy-4-(4'-N,N-diethylaminophenylazo)benzene; curve B: Oil Yellow.

As is clear from the results shown in FIG. 4, very stable halation preventing effect is obtained in the inventive photoresist composition even by the wide range variation in the prebaking temperature in comparison with the conventional photoresist composition leading to a great advantage in the process control.

For further demonstration of the advantages of the invention, photoresist compositions were prepared in the same manner as above with 1-n-propyl-3-methoxy-4-(4'-N,N-diethylaminophenylazo)benzene and 1-n-pentoxy-4-(4'-N,N-diethylaminophenylazo)benzene in place of 1-ethoxy-4-(4'-N,N-diethylaminophenylazo)-benzene in the above Photoresist A and another comparative photoresist composition was prepared with 1-ethoxy-4-(4'-N,N-dimethylaminophenylazo)benzene as the photoextinction agent.

The results of the test undertaken with these inventive and comparative photoresist compositions indicated that both of the above inventive compositions were satisfactory in the solubility in xylene, small tendency of the photoextinction agent to sublimation, good compatibility of the photoextinction agent with the cyclized rubber and the halation preventing effect after prebaking while the comparative composition was inferior in respect of the sublimation of the photoextinction agent.

What is claimed is:

1. A photoresist composition which comprises a cyclized rubber and a bisazide compound as the principal ingredients and 0.5 to 15% by weight based on said rubber of a photoextinction agent which is a compound represented by the general formula

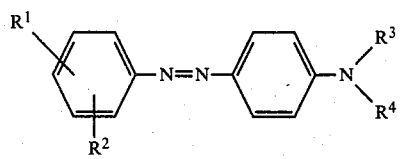

in which $R^1$ is a lower alkoxy group having from 1 to 6 carbon atoms, $R^2$ is a hydrogen atom or a lower alkyl group having from 1 to 4 carbon atoms and $R^3$ and $R^4$ are each a lower alkyl group having at least 2 carbon atoms or an aralkyl group, as a photoextinction agent.

2. The photoresist composition as claimed in claim 1 wherein the alkoxy group represented by the symbol $R^1$ is an ethoxy group.

3. The photoresist composition as claimed in claim 1 wherein the symbol $R^2$ stands for a hydrogen atom or a methyl group.

4. The photoresist composition as claimed in claim 1 wherein the alkyl group represented by the symbols $R^3$ or $R^4$ is selected from the class consisting of ethyl, propyl and butyl groups.

5. The photoresist composition as claimed in claim 1 wherein the aralkyl group represented by the symbols $R^3$ or $R^4$ is a benzyl group.

6. The photoresist composition as claimed in claim 1 wherein the amount of the azobenzene compound is in the range from 0.5 to 15% by weight based on the content of the cyclized rubber.

7. The photoresist composition as claimed in claim 1 wherein the azobenzene compound is 1-ethoxy-4-(4'-N,N-diethylaminophenylazo)benzene.

8. The photoresist composition as claimed in claim 1 wherein the azobenzene compound is 1-n-propyl-3-methoxy-4-(4'-N,N-diethylaminophenylazo)benzene.

9. The photoresist composition as claimed in claim 1 wherein the azobenzene compound is 1-n-pentoxy-4-(4'-N,N-diethylaminophenylazo)benzene.

* * * * *

UNITED STATES PATENT AND TRADEMARK OFFICE
CERTIFICATE OF CORRECTION

PATENT NO. : 4,287,289
DATED : September 1, 1981
INVENTOR(S) : TAKAYUKI SATO

It is certified that error appears in the above—identified patent and that said Letters Patent is hereby corrected as shown below:

Please delete the drawing from Page 1 of the Letters Patent.

Signed and Sealed this

Twenty-fourth Day of November 1981

[SEAL]

Attest:

GERALD J. MOSSINGHOFF

Attesting Officer     Commissioner of Patents and Trademarks